United States Patent
Deng et al.

(10) Patent No.: US 10,771,157 B2
(45) Date of Patent: Sep. 8, 2020

(54) MOBILE TERMINAL AND METHOD FOR RECEIVING AND SENDING A LIFI SIGNAL THEREOF

(71) Applicant: Xiamen Tianma Micro-Electronics Co., Ltd., Xiamen (CN)

(72) Inventors: Zhuo Deng, Xiamen (CN); Chunyan He, Xiamen (CN); Ling Wu, Xiamen (CN); Poping Shen, Xiamen (CN)

(73) Assignee: Xiamen Tianma Micro-Electronics Co., Ltd., Xiamen (CN)

( * ) Notice: Subject to any disclaimer, the term of this patent is extended or adjusted under 35 U.S.C. 154(b) by 0 days.

(21) Appl. No.: 16/387,755

(22) Filed: Apr. 18, 2019

(65) Prior Publication Data

US 2020/0204255 A1 Jun. 25, 2020

(30) Foreign Application Priority Data

Dec. 24, 2018 (CN) .......................... 2018 1 1583070

(51) Int. Cl.
  *H04B 10/116* (2013.01)
  *H04B 10/50* (2013.01)
  *H01L 25/16* (2006.01)

(52) U.S. Cl.
  CPC .......... *H04B 10/116* (2013.01); *H01L 25/167* (2013.01); *H04B 10/502* (2013.01)

(58) Field of Classification Search
  CPC .......... H04B 10/11–116; H04B 10/502; H01L 25/167
  See application file for complete search history.

(56) References Cited

U.S. PATENT DOCUMENTS

2015/0223277 A1* 8/2015 Jovicic .................. H04W 76/14
                                                                          455/41.2
2016/0020854 A1* 1/2016 Engel ................... H04B 10/116
                                                                          398/118
(Continued)

FOREIGN PATENT DOCUMENTS

| CN | 105897968 A | 8/2016 | |
|---|---|---|---|
| CN | 106330313 B | * 11/2017 | .......... H04B 10/516 |
| CN | 107404354 A | 11/2017 | |

OTHER PUBLICATIONS

Chinese Office Action for application No. 201811583070.9. reported on Oct. 24, 2019.

*Primary Examiner* — Casey L Kretzer
(74) *Attorney, Agent, or Firm* — Miller, Matthias & Hull LLP

(57) ABSTRACT

Provided are a mobile terminal and a method for receiving and sending a light fidelity (LIFI) signal of the mobile terminal. The mobile terminal includes a display device. The display device includes a plurality of light emitting elements and a LIFI signal sending control assembly. The LIFI signal sending control assembly is electrically connected to at least one of the plurality of light emitting elements. The display device is configured to control, according to a display signal, the plurality of light emitting elements to emit light for displaying a to-be-displayed picture, and the display device is further configured to control, according to a LIFI sending signal of the LIFI signal sending control assembly, the at least one of the plurality of light emitting elements electrically connected to the LIFI signal sending control assembly to emit a first LIFI signal.

14 Claims, 12 Drawing Sheets

(56) References Cited

U.S. PATENT DOCUMENTS

| | | | |
|---|---|---|---|
| 2017/0179192 A1* | 6/2017 | Zhang | H01L 23/29 |
| 2017/0294962 A1* | 10/2017 | Saes | H04B 10/116 |
| 2019/0007136 A1* | 1/2019 | Ye | H04B 10/502 |
| 2019/0198709 A1* | 6/2019 | Wildeson | H01L 33/38 |

* cited by examiner

FIG. 7

MOBILE TERMINAL AND METHOD FOR RECEIVING AND SENDING A LIFI SIGNAL THEREOF

CROSS-REFERENCES TO RELATED APPLICATIONS

This application claims priority to a Chinese patent application No. 201811583070.9 filed on Dec. 24, 2018, the disclosure of which is incorporated herein by reference in its entirety.

TECHNICAL FIELD

The present disclosure relates to the technical field of visible light communications and, in particular, to a mobile terminal and a method for receiving and sending a light fidelity (LIFI) signal of the mobile terminal.

BACKGROUND

With the development of mobile terminal technologies, users have higher and higher requirements for data transmission speed and data transmission security of mobile terminals. A visible light wireless communication technology, also known as "light fidelity" (LIFI), is a wireless transmission technology that utilizes visible light spectrum (such as the spectrum of illumination light emitted by a light bulb in a room) for data transmission. The technology transmits data by changing the flicker frequency of the light bulb, and the data transmission speed can reach 100 GB.

In general, when a microchip is added to a common light bulb, the light bulb flashes at a very high frequency (exemplarily, at a flicker frequency of millions of times per second), and data can be sent with the light bulb. However, the security of the current method for LIFI signal transmission is still poor.

SUMMARY

The present disclosure provides a mobile terminal and a method for receiving and sending a LIFI signal of the mobile terminal, for improving the security of LIFI signal transmission.

In a first aspect, an embodiment of the present disclosure provides a mobile terminal. The mobile terminal includes a display device. The display device includes a plurality of light emitting elements and a LIFI signal sending control assembly. The LIFI signal sending control assembly is electrically connected to at least one of the plurality of light emitting elements.

The display device is configured to control, according to a display signal, the plurality of light emitting elements to emit light for displaying a to-be-displayed picture, and the display device is further configured to control, according to a LIFI sending signal from the LIFI signal sending control assembly, the at least one of the plurality of light emitting elements electrically connected to the LIFI signal sending control assembly to emit a first LIFI signal.

The at least one of the plurality of light emitting elements for emitting the first LIFI signal is at least one of the plurality of light emitting elements for displaying the to-be-displayed picture.

In a second aspect, an embodiment of the present disclosure further provides a method for receiving and sending a LIFI signal of a mobile terminal. The method is executed by the mobile terminal provided in the first aspect. The method includes:

controlling according to the display signal, by the display device, the plurality of light emitting elements to emit light for displaying the to-be-displayed picture, and controlling according to the LIFI sending signal from the LIFI signal sending control assembly, by the display device, the at least one of the plurality of light emitting elements electrically connected to the LIFI signal sending control assembly to emit the first LIFI signal.

The mobile terminal provided by the embodiment of the present disclosure includes a display device. The display device is configured to include a plurality of light emitting elements and a LIFI signal sending control assembly. The LIFI signal sending control assembly is electrically connected to at least one of the plurality of light emitting elements. The display device is configured to control, according to a display signal, the plurality of light emitting elements to emit light for displaying a to-be-displayed picture, and the display device is further configured to control, according to a LIFI sending signal from the LIFI signal sending control assembly, the at least one of the plurality of light emitting elements electrically connected to the LIFI signal sending control assembly to emit a first LIFI signal. The at least one of the plurality of light emitting elements for emitting the first LIFI signal is at least one of the plurality of light emitting elements for displaying the to-be-displayed picture. At least one of the plurality of light emitting elements for displaying the to-be-displayed picture may be used to emit the first LIFI signal while the display device in the mobile terminal is displaying the to-be-displayed picture. At the same time, the light emitting elements may be used to emit different first LIFI signals while the same to-be-displayed picture is being displayed. Thus, the security of LIFI signal transmission can be improved.

BRIEF DESCRIPTION OF DRAWINGS

FIG. 7 is a schematic diagram of another first LIFI signal emitted from the mobile terminal of FIG. 1;

DETAILED DESCRIPTION

Figure 1:
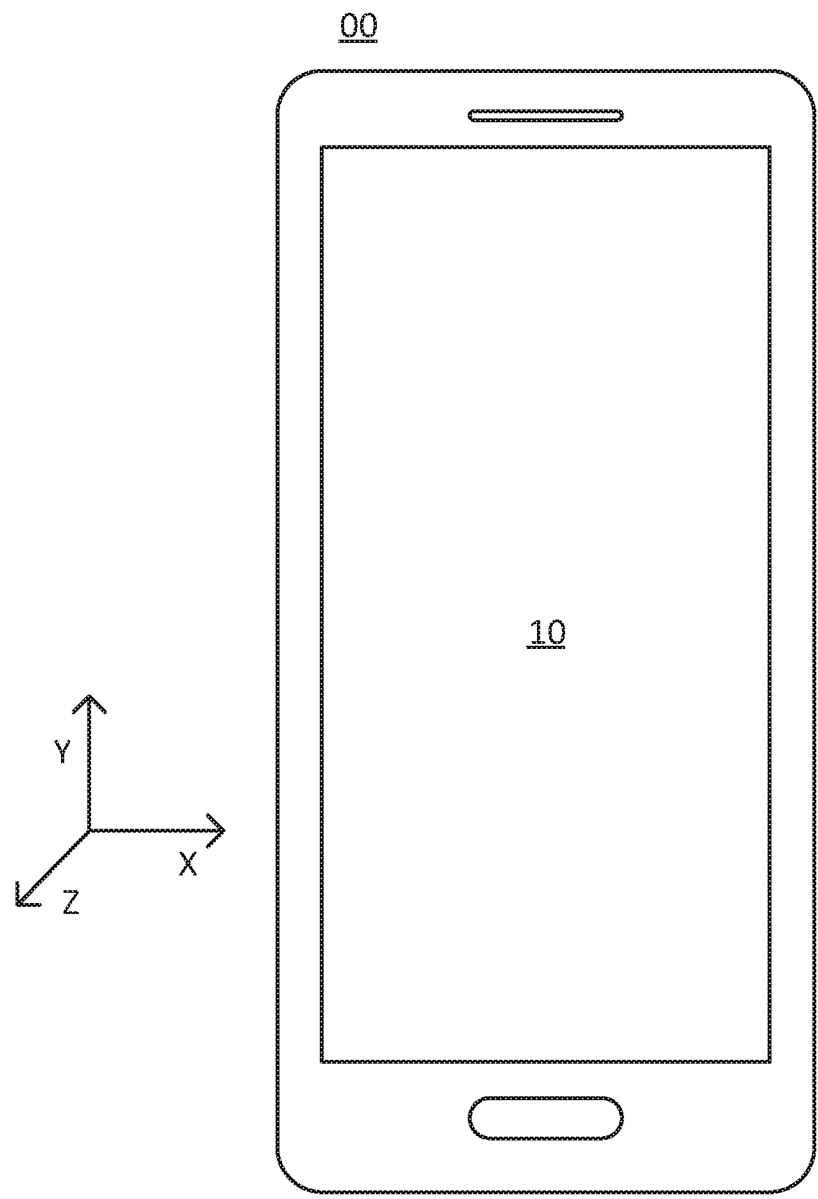
FIG. 1 is a structural diagram of a mobile terminal according to an embodiment of the present disclosure.

Hereinafter the present disclosure will be further described in detail in conjunction with the drawings and embodiments. It should be understood that the specific embodiments set forth below are merely intended to illustrate and not to limit the present disclosure. Additionally, it should be noted that, for ease of description, only part, not all, of the structures related to the present disclosure are illustrated in the drawings.

In the related art, the advantages of data transmission through LIFI are mainly reflected in the high transmission rate, wide frequency range, high confidentiality and security, no electromagnetic radiation, rich spectrum, high density, low cost, green and low energy consumption. The data transmission through LIFI is usually performed in a manner: a microchip is added to a light bulb for lighting in a room or to a light bulb commonly used as a flash in a mobile terminal, so that the light bulb flashes at a preset frequency, and thereby data is transmitted by using the light bulb. In this way, the light bulb can quickly transmit binary code (exemplarily, the binary code may be 1001001 . . . ). This flicker of the light bulb is not visible to the naked eyes, and the LIFI signal (understood as a binary code signal transmitted by the LIFI) is detected by a photosensitive receiver. The principle of this LIFI signal transmission manner is similar to the use of a torch to send a Morse code, but the LIFI signal is transmitted faster and an alphabet that can be understood by the computer is used. However, the above LIFI signal transmission manner is merely as described below. A microchip is added to a separate light bulb, the light bulb is used to perform LIFI signal transmission, and binary code transmitted by the LIFI signal is obtained by performing LIFI signal detection on the light bulb. This is highly targeted, and the security is low.

In response to the above problems, an embodiment of the present disclosure provides a mobile terminal. A display device in the mobile terminal is configured to include a plurality of light emitting elements and a LIFI signal sending control assembly, and the LIFI signal sending control assembly is electrically connected to at least one of the plurality of light emitting elements. At least one of the plurality of light emitting elements may be used to emit the first LIFI signal when the plurality of light emitting elements of the display device displays the to-be-displayed picture. A parameter to be considered when the light emitting elements are used to display the to-be-displayed picture is usually the light emitting intensity information (i.e., the brightness information) of the light emitting elements, and a parameter to be considered when the light emitting elements are used to emit the first LIFI signal is usually the flicker frequency information of the light emitting elements, so different first LIFI signals can be emitted, by adjusting the duty ratio (also understood as pulse width modulation, (PWM)) of the light emitting signals of the light emitting elements, on the premise that the same brightness information is outputted. Therefore, the security of LIFI signal transmission is improved.

The mobile terminal provided by the embodiment of the present disclosure is exemplarily described below in conjunction with the embodiments.

Figure 2:
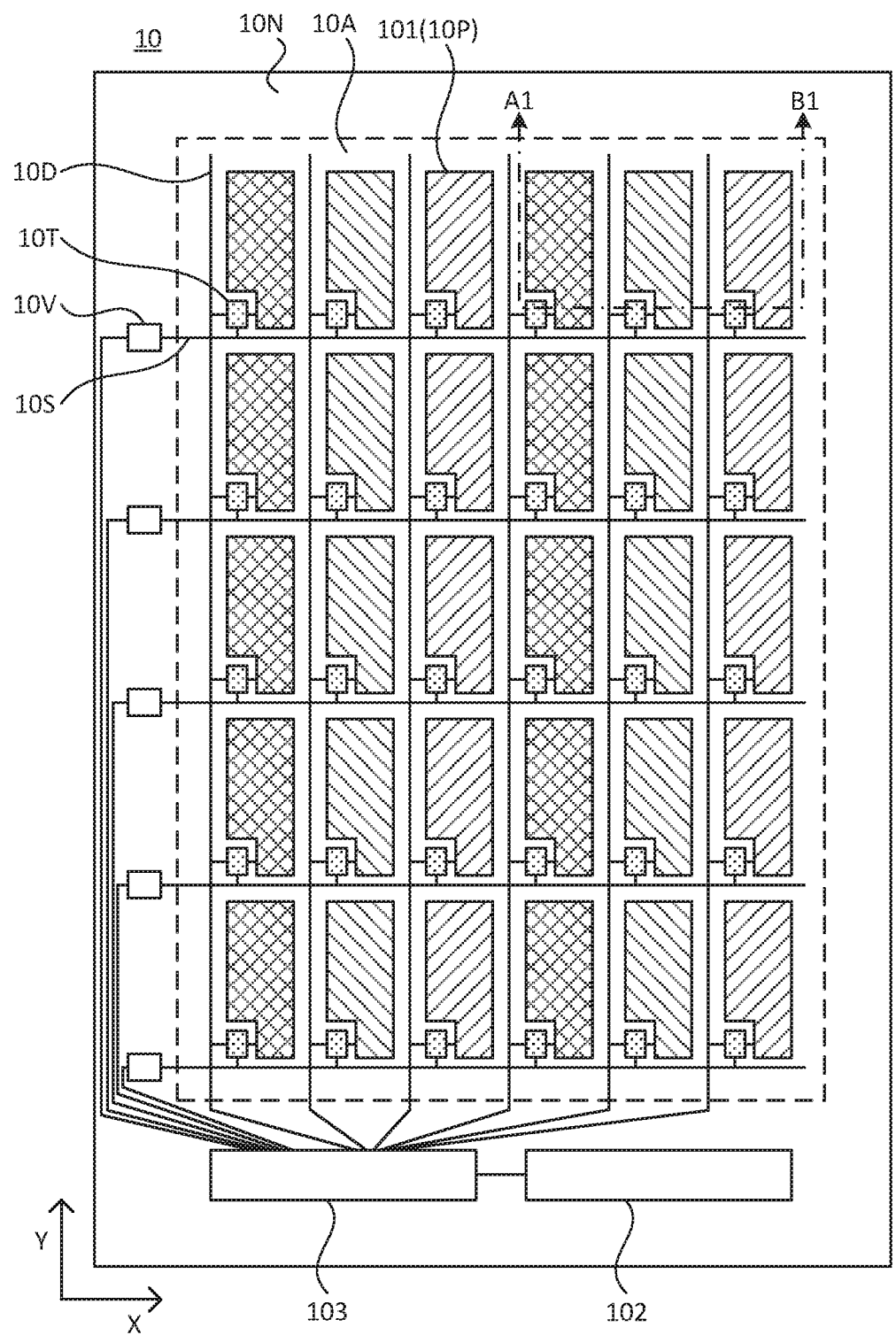
FIG. 2 is a plan view of a display device of FIG. 1.
Figure 3:
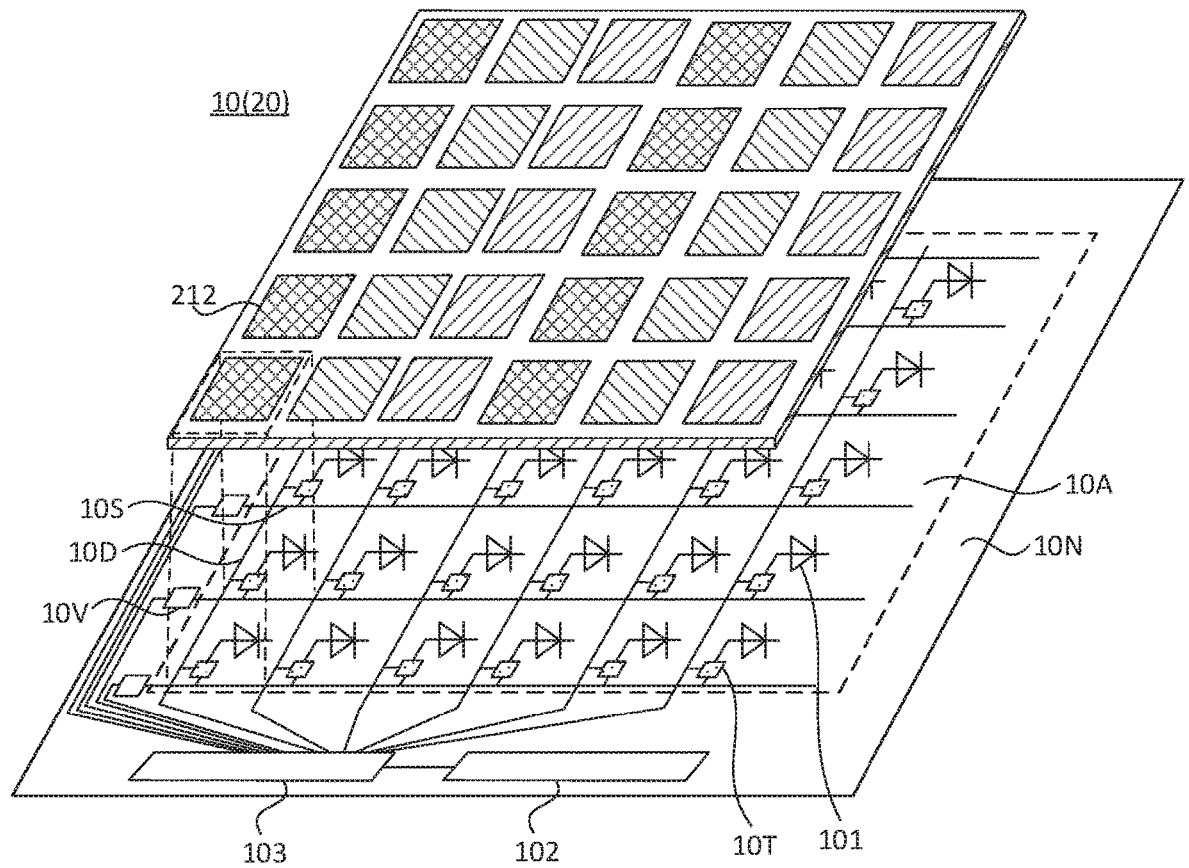
FIG. 3 is a perspective view of another display device of FIG. 1.

Exemplarily, FIG. 1 is a structural diagram of a mobile terminal according to an embodiment of the present disclosure, FIG. 2 is a structural diagram of a display device of FIG. 1, and FIG. 3 is a perspective view of another display device of FIG. 1. Referring to FIGS. 1 to 3, a mobile terminal 00 includes a display device 10. The display device 10 includes a plurality of light emitting elements 101 and a light fidelity (LIFI) signal sending control assembly 102. The LIFI signal sending control assembly 102 is electrically connected to at least one of the plurality of light emitting elements 101. The display device 10 is configured to control, according to a display signal, the plurality of light emitting elements 101 to emit light for displaying a to-be-displayed picture, and the display device 10 is further configured to control, according to a LIFI sending signal from the LIFI signal sending control assembly 102, the at least one of the plurality of light emitting elements 101 electrically connected to the LIFI signal sending control assembly to emit a first LIFI signal. The at least one of the plurality of light emitting elements 101 for emitting the first LIFI signal is at least one of the plurality of light emitting elements 101 for displaying the to-be-displayed picture.

The mobile terminal 00 implements the picture display function through the display device 10. Exemplarily, the mobile terminal 00 may be a laptop, a smart wearable device, a mobile phone (FIG. 1 merely exemplarily shows that the mobile terminal 00 is the mobile phone) or another type of mobile terminal which has the picture display function and which is known to those skilled in the art. The mobile terminal is not limited in the embodiments of the present disclosure. In addition to the display device 10, the mobile terminal 00 may further include a flash, a camera, a receiver, a microphone, or other functional components known to those skilled in the art, which is not limited in the embodiments of the present disclosure.

The plurality of light emitting elements 101 in the display device 10 emit light, and the light may be directly used to display the to-be-displayed picture. Exemplarily, the display device 10 may be a light emitting diode display device. In the structure (referring to FIG. 2), the light emitting elements 101 may directly correspond to the pixel structure of the display device 10; or light emitted by the plurality of light emitting elements 101 in the display device 10 is used as backlight in the display device 10 for displaying the to-be-displayed picture. Exemplarily, the display device 10 may be a liquid crystal display device. The structure (referring to FIG. 3) further includes a liquid crystal display panel 20. The liquid crystal display panel 20 is provided with a color resist block 212. The light emitting elements 101 and the color resist block 212 corresponding thereto together correspond to the pixel structure of the display device 10. A longitudinal (i.e., the third direction Z shown in FIG. 1, the direction is perpendicular to a light exit surface of the display device 10, the light exit surface is a plane determined by the first direction X and the second direction Y, and the plane may also be referred to as a transverse plane) film structure of the display device 10 is described below in detail.

From the perspective of display effects, the display signal may include a display color signal and a display brightness signal. From the perspective of display control, the display signal may include a data signal and a scan signal. The LIFI sending signal may include a logic high level signal and/or a logic low level signal corresponding to the LIFI signal, and may further include a timing signal related to the logic high level signal and/or the logic low level signal.

The LIFI signal sending control assembly 102 is configured to emit a LIFI sending signal. At least one of the plurality of light emitting elements 101 for displaying a to-be-displayed picture responds to the LIFI sending signal to emit the first LIFI signal when the to-be-displayed picture is displayed. The first LIFI signal is a LIFI optical signal.

Exemplarily, the LIFI signal sending control assembly 102 may be a control circuit. The control circuit may be integrated with a display control assembly in the display device 10 to improve the integration degree of the display device 10. Therefore a design of small-sized portable display devices 10 and mobile terminals 00 is implemented.

Exemplarily, the first LIFI signal emitted by one light emitting element 101 may be regarded as a one-dimensional (time dimension) LIFI signal, and the first LIFI signal emitted by the plurality of light emitting elements 101 may be regarded as a two-dimensional (spatial dimension) LIFI signal. The one-dimensional LIFI signal and the two-dimensional LIFI signal are described in detail below.

When the brightness information of the light emitting elements 101 is the same, different flicker frequency information may be emitted so as to emit different first LIFI signals. Therefore, when the plurality of light emitting elements 101 display the same to-be-displayed picture, the first LIFI signals of different frequencies may be synchronously emitted. Therefore, the safety of the LIFI signal transmission can be improved.

Exemplarily, still referring to FIG. 2, the display device 10 includes a display area 10A and a non-display area 10N surrounding the display area 10A. The light emitting elements 101 may be disposed in the display area 10A, and the LIFI signal sending control assembly 102 may be disposed in the non-display area 10N. The display area 10A further includes sub-pixels 10P arranged in an array. The position of each of the sub-pixels 10P may correspond to one or more light emitting elements 101, which can be set according to the actual requirements of the display device 10, and is not limited in the embodiments of the present disclosure.

It should be noted that FIG. 2 only exemplarily shows that the display device 10 includes 30 light emitting elements 101, and the 30 light emitting elements 101 are arranged in an array of six columns and five rows, but FIG. 2 is not intended to limit the display device 10 and the mobile terminal 00 provided in the embodiments of the present disclosure. In other embodiments, the number of the light emitting elements 101 and the arrangement thereof may be set according to the actual requirements of the display device 10 and the mobile terminal 00, and are not limited in the embodiments of the present disclosure.

Next, it should be noted that FIG. 2 only exemplarily shows one shape of the light emitting elements 101, and is not intended to limit the display device 10 and the mobile terminal 00 provided in the embodiments of the present disclosure. In other embodiments, the shape of the light emitting elements 101 may be set according to the actual requirements of the display device 10 and the mobile terminal 00, and is not limited in the embodiments of the present disclosure.

In the following, the longitudinal film structure of the display device 10 in the mobile terminal 00 provided by the embodiment of the present disclosure is described exemplarily by taking the display device 10 as a liquid crystal display device and a light emitting diode display device as examples.

Figure 4:
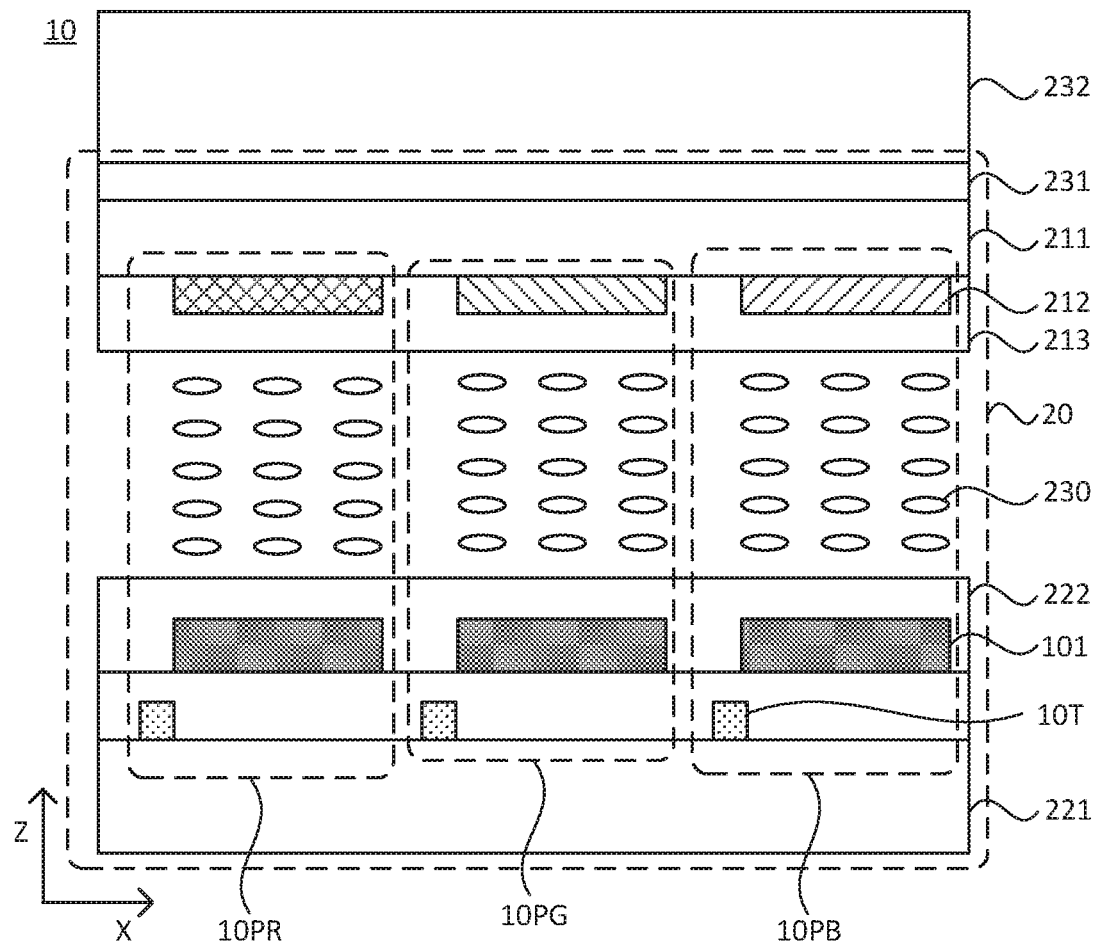
FIG. 4 is a sectional view of a structure of FIG. 2 taken along a section line A1-B1.

Optionally, FIG. 4 is a sectional view of a structure of FIG. 2 taken along a section line A1-B1, and shows the longitudinal film structure of the display device 10 in condition that the display device 10 in the mobile terminal 00 is a liquid crystal display device. Combined with FIGS. 2, 3 and 4, the display device 10 further includes a liquid crystal display panel 20, the liquid crystal display panel 20 is disposed on a light exit side of the plurality of light emitting elements 101, and the plurality of light emitting elements 101 are used to provide backlight for the liquid crystal display panel 20.

The liquid crystal display panel 20 may include a first base substrate 211 and a second base substrate 221 disposed opposite to each other. A color resist block 212 is formed on a side of the first base substrate 211 facing towards the second base substrate 221. Exemplarily, the color of the color resist block 212 may be red, green, or blue, and a red sub-pixel 10PR, a green sub-pixel 10PG, and a blue sub-pixel 10PB may be respectively formed. The light emitting elements 101 are formed on a side of the second base substrate 221 facing towards the first base substrate 211. Exemplarily, each of the light emitting elements 101 provides backlight for one sub-pixel. A first planarization layer 213 is formed on a side of the color resist block 212 facing away from the first base substrate 211, a second planarization layer 222 is formed on a side of the light emitting elements 101 facing away from the second base substrate 221, and a liquid crystal layer 230 is disposed between the first flat layer 213 and the second flat layer 222. In condition that a voltage is applied on the liquid crystal layer, liquid crystal molecules in the liquid crystal layer 230 can be deflected, so that the light emitted from the light emitting elements 101 can be controlled to exit from the light exit surface or not, and the color of the exit light can be controlled by the color resist block 212. Thereby, the to-be-displayed picture is displayed by the display device 10.

In addition, the display device 10 may further include a protective cover plate 232 disposed on the light exit side of the liquid crystal display panel 20 and fixedly bonded to the liquid crystal display panel 20 through an adhesive layer 231. Therefore, the protective cover plate 232 may be used to protect the liquid crystal display panel 20, and the light exit side surface of the liquid crystal display panel 20 may be prevented from being scratched. Thereby, the picture display effect of the display device 10 may be guaranteed and the life of the display device 10 may be expanded.

It should be noted that, FIGS. 3 and 4 merely exemplarily show that the color resist block 212 has three colors, and that the position of each color resist block 212 corresponds to one light emitting element 101, but FIGS. 3 and 4 are not intended to limit the display device 10 and the mobile terminal 00 provided in the embodiments of the present disclosure. In other embodiments, the number of the color resist block 212, the color type of colors of the color resist block 212 and the number of the light emitting elements 101 corresponding to the position of each color resist block 212 may be set according to the actual requirements of the mobile terminal 00 and the display device 10, and are limited in the embodiments of the present disclosure.

In addition, it should be noted that when the display device 10 is a liquid crystal display device, the liquid crystal display device may further include a pixel electrode layer, a common electrode layer, a lower polarizer, an upper polarizer, and an extinction module (for eliminating the effect of reflected ambient light on the picture), or other structures or components known to those skilled in the art, which is not limited in the embodiments of the present disclosure.

Optionally, the light emitting element 101 is a mini-LED.

The LED is known as Light Emitting Diode, and a mini-LED refers to a single LED having a size of several hundred micrometers (μm). Exemplarily, a single LED may have a size of 100 μm to 500 μm. The "size" herein is understood as the maximum length among or the average length of the lengths of the LED in various directions in the transverse plane.

In this way, the mini-LED may be used to provide backlight for the liquid crystal display panel 20. Each mini-LED may be separately driven by the driving circuit, so that the display device 10 uses the light of the mini-LED as the backlight to implement normal picture display, and synchronously uses the light emitted by the mini-LED to emit the first LIFI signal at the same time. Therefore, the integration of the picture display and the wireless signal transmission is implemented, and the security of the LIFI signal transmission is improved.

In addition, a better picture display effect is achieved by using the mini-LED to provide backlight for the liquid crystal display panel 20. Therefore, under the premise of ensuring good picture display quality, it is advantageous to reduce the difficulty in laying the light emitting elements 101 and the difficulty of the fabrication process, thereby reducing the fabrication cost of the display device 10 and the mobile terminal 00.

It should be noted that the above description only exemplarily shows that the mini-LED is used to provide backlight for the liquid crystal display panel, but is not intended to limit the display device 10 and the mobile terminal 00 provided in the embodiments of the present disclosure. In other embodiments, the type and specification (exemplarily, the "specification" herein may be understood as a size) of the light emitting elements 101 may also be configured according to the actual requirements of the display device 10 and the mobile terminal 00, and are not limited in the embodiments of the present disclosure.

Figure 5:
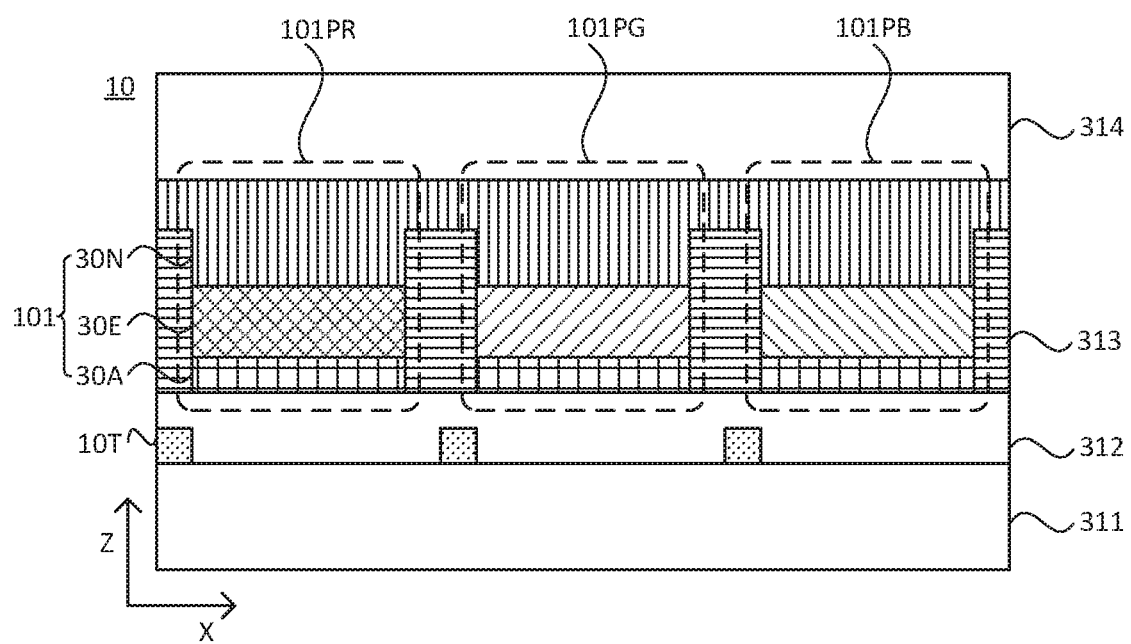
FIG. 5 is another sectional view of a structure of FIG. 2 taken along the section line A1-B1.

Optionally, FIG. 5 is another sectional view of a structure of FIG. 2 taken along the section line A1-B1, and shows the longitudinal film structure of the display device 10 when the display device 10 in the mobile terminal 00 is a light emitting diode display device. Combined with FIGS. 2 and 5, the plurality of light emitting elements 101 in the (light emitting diode) display device 10 are used to emit light for directly displaying a to-be-displayed picture. Each of the light emitting elements 101 includes a first electrode 30A, a second electrode 30N, and a light emitting material layer 30E disposed between the first electrode 30A and the second electrode 30N. The plurality of light emitting elements 101 includes red light emitting elements 101PR, green light emitting elements 101PG, and blue light emitting elements 101PB.

Exemplarily, the first electrode 30A may be an anode, and the second electrode 30N may be a cathode. The light emitting material layer 30E may be a red light emitting material layer, a green light emitting material layer or a blue light emitting material layer, and a red light emitting element 101PR, a green light emitting element 101PG, and a blue light emitting element 101PB may be respectively and correspondingly formed.

Exemplarily, the material of the light emitting material layer 30E may be an organic light emitting material.

Exemplarily, the display device 10 may further include a first substrate 311 and a driving circuit layer 312 formed on a side of the light emitting elements 101 facing towards the base substrate. The driving circuit layer 312 includes a plurality of driving circuits 10T electrically connected to the light emitting elements 101 in one-to-one correspondence (the connection manner is not shown in FIG. 5). The display device 10 further includes a spacer layer 313 and a protective layer 314.

The spacer layer 313 is at least disposed between the first electrodes 30A of the adjacent light emitting elements 101 and between the light emitting material layers 30E of the adjacent light emitting elements 101, thereby ensuring that each of the light emitting elements 101 can be separately driven for achieving that the display device 10 normally displays the to-be displayed picture. The protective layer 314 is located on a side of the light emitting elements 101 facing away from the first substrate 311, for protecting the light emitting elements 101, reducing the influence of water and oxygen on the performance of films in the light emitting elements 101 and prolonging the life thereof, thereby extending the service life of the display device 10 and the mobile terminal 00.

Exemplarily, the protective layer 314 may be a hard protective cover, that is, the protective layer may be a second substrate disposed opposite to the first substrate 311; or the protective layer 314 may be a thin film protective layer, thereby achieving the thin and light design of the display device 10 and the mobile terminal 00.

When the display device 10 is a light emitting diode display device, the longitudinal film structure of the display device is simple, which is advantageous for reducing the total longitudinal thickness of the display device 10, thereby facilitating the thin and light design of the display device 10 and the mobile terminal 00.

It should be noted that FIG. 5 merely exemplarily shows the light emitting material layer 30E has three colors, and is not intended to limit the display device 10 and the mobile terminal 00 provided in the embodiments of the present disclosure. In other embodiments, the number and type of colors of the light emitting material layer may be set according to the actual requirements of the display device 10 and the mobile terminal 00, and are not limited in the embodiments of the present disclosure.

In addition, it should be noted that when the display device 10 is a light emitting diode display device, the display device may further include an extinction module (for eliminating the effect of reflected ambient light on the picture), or other structures or components known to those skilled in the art, which is not limited in the embodiments of the present disclosure.

Optionally, the light emitting element 101 is a Micro-LED.

The Micro-LED refers to a single LED having a size of less than a few tens of micrometers (μm). Exemplarily, a single LED may have a size of less than 50 μm. The "size" herein may also be understood as the maximum length among or the average length of the lengths of the LED in various directions in the transverse plane.

In this way, the Micro-LED may be used to emit light for directly displaying the to-be-displayed picture. Each Micro-LED may be separately driven by the driving circuit, so that the display device 10 uses the light of the Micro-LED to directly display the to-be-displayed picture, and synchronously uses the light of the Micro-LED to emit the first LIFI signal. Therefore, the integration of the picture display and the wireless signal transmission is implemented, and the security of the LIFI signal transmission is improved.

In addition, the Micro-LED is used to emit light for directly displaying the to-be-displayed picture, and a large number of Micro-LEDs may be disposed in a certain area since the size of the Micro-LED is small, thereby improving the delicateness of the picture display, that is, improving the picture display effect of the display device 10.

It should be noted that the above description only exemplarily shows that the Micro-LED is used to emit light for directly displaying the to-be-displayed picture, but is not intended to limit the display device 10 and the mobile terminal 00 provided in the embodiments of the present disclosure. In other embodiments, the type and specification of the light emitting elements 101 may be set according to the actual requirements of the display device 10 and the mobile terminal 00, and is not limited in the embodiments of the present disclosure.

Optionally, still referring to FIG. 2, the display device 10 further includes a plurality of driving circuits 10T and a display control assembly, and the plurality of driving circuits 10T are electrically connected to the plurality of light emitting elements 101 in one-to-one correspondence. The display control assembly 103 is configured to generate a light emitting signal according to the display signal and the LIFI sending signal from the LIFI signal sending control assembly 102. Each of the plurality of driving circuits 10T is configured to receive the light emitting signal, and drive, according to the light emitting signal, a respective one of the plurality of light emitting elements 101 to emit light for displaying the to-be-displayed picture. Light emitted by the respective one of the plurality of light emitting elements 101 includes the first LIFI signal.

The driving circuit 10T may also be referred to as a pixel driving circuit, and the specific circuit element composition thereof may include a thin film transistor, a capacitor, and other circuit elements known to those skilled in the art. In the meantime, the circuit elements may be connected in any one of the connection manners known to those skilled in the art, and the details are not described and limited herein.

The display control assembly 103 and the LIFI signal sending control assembly 102 can be integrally disposed on a printed circuit board or a flexible circuit board for simplifying the circuit design and improving the integration degree of the display device 10 and the mobile terminal 00.

The display control assembly 103 generates a light emitting signal according to the display signal and the LIFI sending signal, and transmits the light emitting signal to a respective driving circuit 10T. The driving circuit 10T receives the light emitting signal, and controls, according to the light emitting signal, the light emitting element 101 electrically connected thereto to emit light. The light emitted by the light emitting element 101 is configured to display a to-be-displayed picture, and further includes a first LIFI signal. Therefore, the mobile terminal 10 synchronously implements the functions of displaying the picture and sending the first LIFI signal.

It should be noted that FIG. 2 only exemplarily shows that the vertical projection of each of the driving circuits 10T and the vertical projection of each of the light emitting elements 101 on the plane determined by the first direction X and the second direction Y do not overlap, and is not intended to limit the display device 10 and the mobile terminal 00 provided in the embodiments of the present disclosure. In other embodiments, the relative positional relationship between each of the driving circuits 10T and each of the light emitting elements 101 may be set according to the actual requirements of the display device 10 and the mobile terminal 00, and is not limited in the embodiments of the present disclosure.

Next, it should be noted that the display control assembly 103 and the LIFI signal sending control assembly 102 are only functional divisions. In FIG. 2, in order to clearly show the electrical connection relationship between the two assemblies, rectangular boxes are used to represent the two assemblies, respectively, and FIG. 2 is not intended to limit the display device 10 and the mobile terminal 00 provided in the embodiments of the present disclosure. In other embodiments, the spatial positional relationship between the display control assembly 103 and the LIFI signal sending control assembly 102 may be set according to the actual requirements of the display device 10 and the mobile terminal 00, and is not limited in the embodiments of the present disclosure.

Optionally, the display device may further include a scan line 10S, a data line 10D, and a shift register 10V. The scan line 10S intersects the data line 10D, so that a pixel area is defined. Each pixel area is provided with one light emitting element 101. Each shift register 10V is sequentially cascaded, and provides a scan signal to the light emitting element 101 through the scan line 10S, and the data line 10D is used to provide a data signal to the light emitting element 101. Each of the driving circuits 10T includes an input terminal, an output terminal, and a control terminal. The control terminal is electrically connected to the scan line 10S, the input terminal is electrically connected to the data line 10D, and the output terminal is electrically connected to the light emitting element 101. The light emitting element 101 emits light with preset brightness and a preset frequency under a cooperative control of the scan signal and the data signal. The preset brightness corresponds to displaying a to-be-displayed picture, and the preset frequency corresponds to emitting the first LIFI signal.

It should be noted that FIG. 2 merely exemplarily shows a structure of the display device, and is not intended to limit the display device 10 and the mobile terminal 00 provided in the embodiments of the present disclosure. In other embodiments, the structure of the display device 10 may be set according to the actual requirements of the mobile terminal 00, and is not limited in the embodiments of the present disclosure.

The one-dimensional LIFI signal and the two-dimensional LIFI signal will be exemplarily described below.

Figure 6:
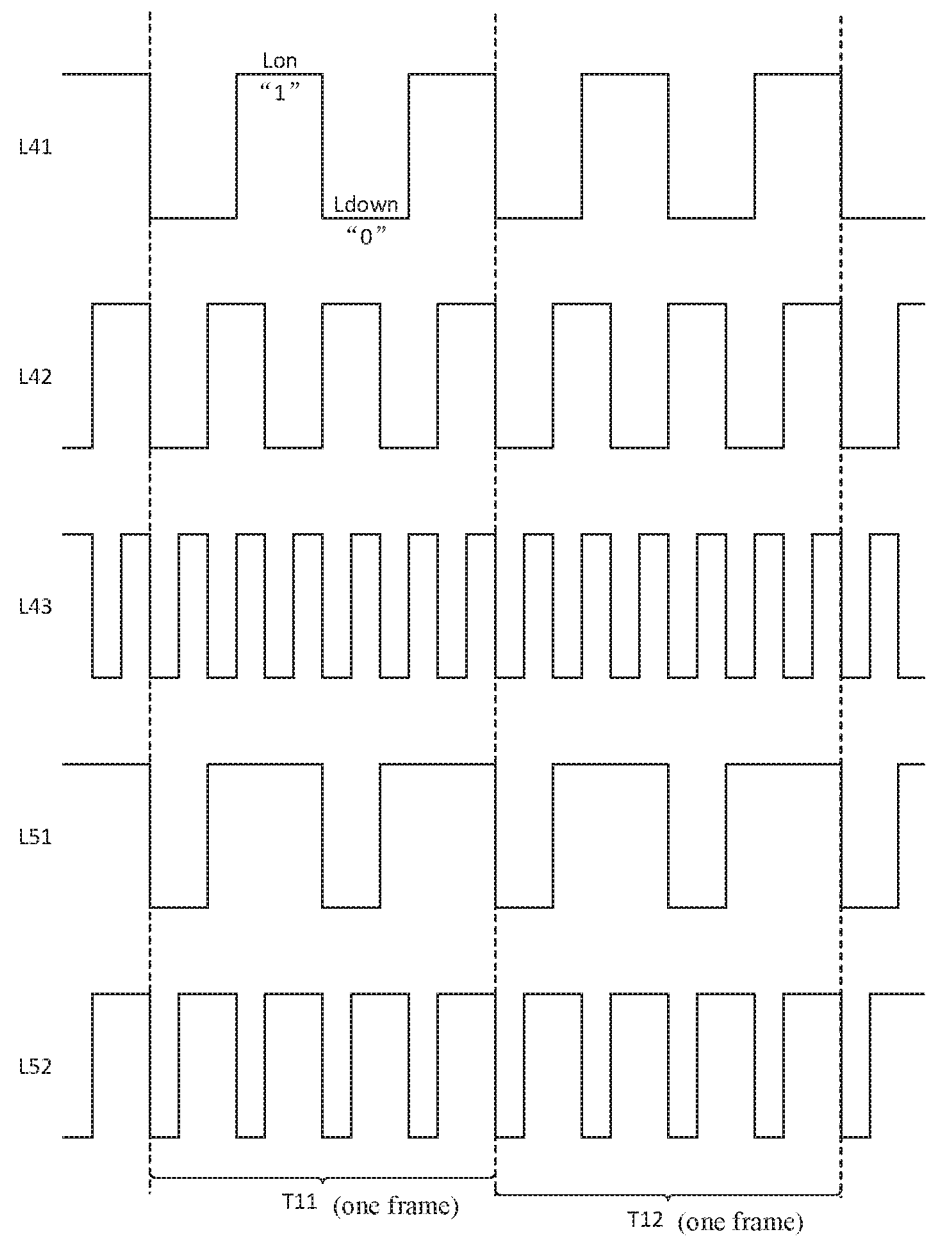
FIG. 6 is a schematic diagram of a first LIFI signal emitted from the mobile terminal of FIG. 1.

FIG. 6 is a schematic diagram of a first LIFI signal emitted from the mobile terminal of FIG. 1. Referring to FIG. 6, when the display device 10 displays a frame of the to-be-displayed picture, the display device 10 is further configured to control the light emitting element 101 to output the first LIFI signal having a preset frequency, so that the light emitting element 101 emits an optical signal having a preset light emitting intensity.

Exemplarily, the first flicker frequency signal L41, the second flicker frequency signal L42, and the third flicker frequency signal L43 are regarded as the first group of first LIFI signals; and the fourth flicker frequency signal L51 and the fifth flicker frequency signal L52 are regarded as the second group of first LIFI signals. The first time period T11 and the second time period T12 are equal in time, and each correspond to the duration of one frame. The first LIFI signal includes a logic high level signal Lon and a logic low level signal Ldown. The logic high level signal Lon corresponds to 1 in binary code and the logic low level signal Ldown corresponds to 0 in the binary code. For a period of time (exemplarily, taking the first time period T11 or the second time period T12 as an example) corresponding to one frame, the binary code information corresponding to the first group of LIFI signals and the second group of LIFI signals is respectively described below.

The first flicker frequency signal L41 corresponds to 000111000111.

The second flicker frequency signal L42 corresponds to 001100110011.

The third flicker frequency signal L43 corresponds to 010101010101.

The fourth flicker frequency signal L51 corresponds to 001111001111.

The fifth flicker frequency signal L52 corresponds to 011011011011.

The duty ratio of the light corresponding to the first group of first LIFI signals is the same, which is one-half, so that the corresponding brightness information (the brightness information may be referred to as the first brightness) is the same, and may be used for displaying the same to-be-displayed picture. At the same time, the flicker frequencies of the first group of first LIFI signals are different, thereby corresponding to three different first LIFI signals. Similarly, the duty ratio of the light corresponding to the second group of first LIFI signals is the same, which is two-thirds, so that the corresponding brightness information (the brightness information may be referred to as the second brightness) is the same, and may be used for displaying the same to-be-displayed picture. At the same time, the flicker frequencies of the second group of first LIFI signals are different, thereby corresponding to two different first LIFI signals.

The content expressed in the preceding paragraph may also be understood as that: when the light emitting element 101 needs to output brightness information having the first brightness, the light emitting element 101 may emit light by using any one of the first flicker frequency signal L41, the second flicker frequency signal L42, and the third flicker frequency signal, so that the light emitting element 101 may emit different first LIFI signals. Similarly, when the light emitting element 101 needs to output brightness information having the second brightness, the light emitting element 101 may emit light by using either one of the fourth flicker frequency signal L51 and the fifth flicker frequency signal L52, so that the light emitting element 101 may emit different first LIFI signals.

Therefore, when the display picture of the display device 10 is consistent, the same brightness information can be outputted and corresponds to different first LIFI signals by adjusting the duty ratio and frequency of light emitted by the light emitting element 101, so that the purpose of encrypted information transmission is achieved and the security of LIFI signal transmission can be improved.

It should be noted that FIG. 6 merely exemplarily shows several types of one-dimensional LIFI signals, and is not intended to limit the one-dimensional LIFI signal provided in the embodiments of the present disclosure. In other embodiments, the duty ratio and flicker frequency of the light emitting element 101 may be set according to the actual requirements of the display device 10 and the mobile terminal 00, and is not limited in the embodiments of the present disclosure.

Next, each of the first LIFI signals shown in FIG. 6 is formed based on the time dimension, and may be regarded as a one-dimensional LIFI signal in a time dimension, and may also be understood that a single light emitting element 101 is used to emit a one-dimensional LIFI signal. When a plurality of light emitting elements 101 are provided, the plurality of light emitting elements 101 may also be used to emit a two-dimensional LIFI signal in a spatial dimension. The first LIFI signals shown in FIG. 7 are exemplarily described below.

Figure 7:
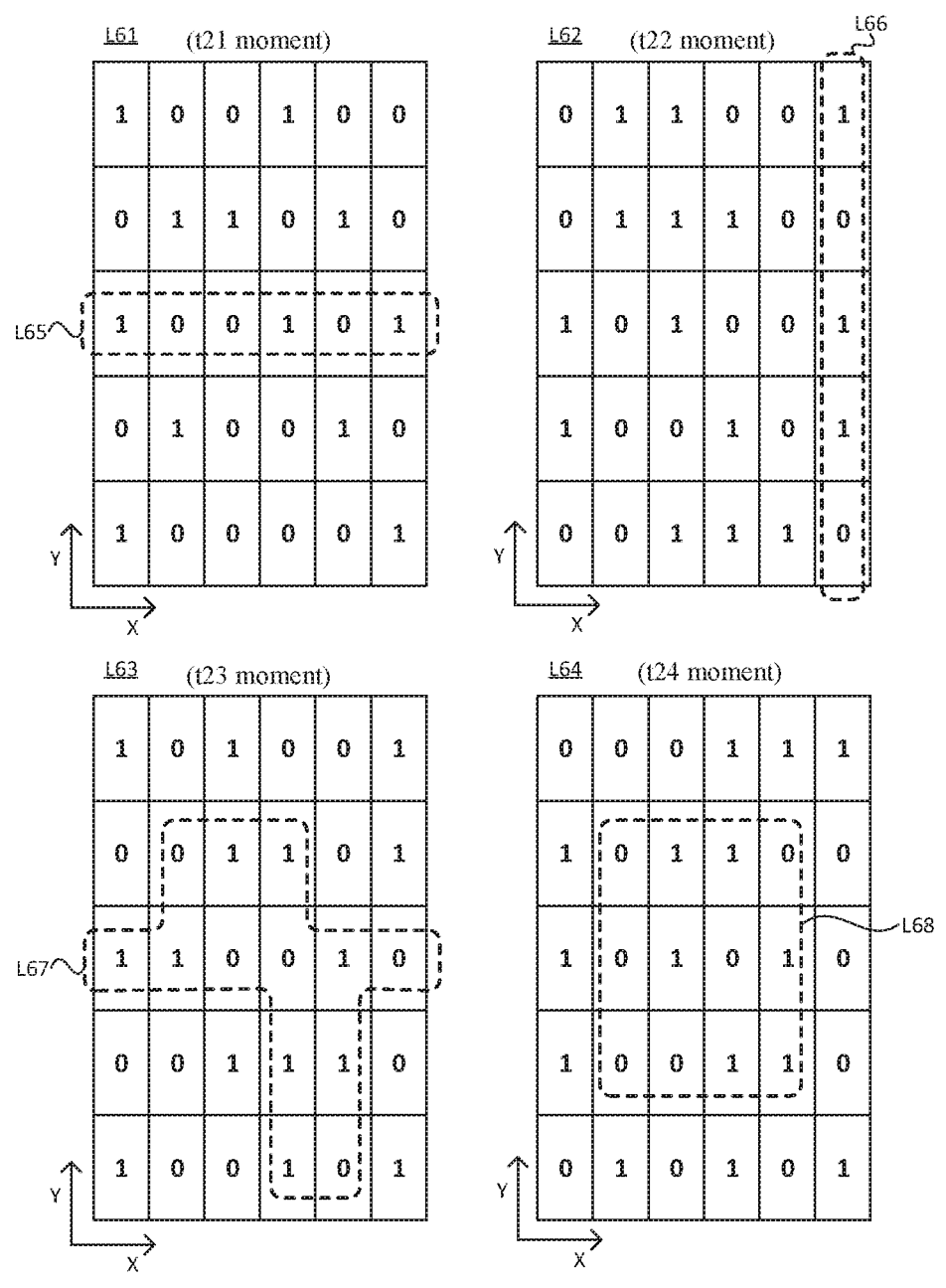

Optionally, FIG. 7 is a schematic diagram of another first LIFI signal emitted from the mobile terminal of FIG. 1 and shown in the form of corresponding binary code information. Referring to FIGS. 2, 6 and 7, at least two light emitting elements 101 in the display device 10 are configured to emit a logic high level signal Lon and/or a logic low level signal Ldown at a current moment to emit a first LIFI signal. The logic high level signal Lon corresponds to 1 in the binary code, and the logic low level signal Ldown corresponds to 0 in the binary code. A first LIFI signal corresponds to an item of binary code information in a two-dimensional space, and the first LIFI signal may be regarded as a two-dimensional LIFI signal.

Exemplarily, FIG. 7 shows eight types of two-dimensional LIFI signals (respectively a first two-dimensional LIFI signal L61, a second two-dimensional LIFI signal L62, a third two-dimensional LIFI signal L63, a fourth two-dimensional LIFI signal L64, a fifth two-dimensional LIFI signal L65, a sixth two-dimensional LIFI signal L66, and a seventh two-dimensional LIFI signal L67 and an eighth two-dimensional LIFI signal L68) at four time moments (respectively a first time moment t21, a second time moment t22, a third time moment t23, and a fourth time moment t24).

At the current moment, the plurality of light emitting elements 101 may emit the logic high level signal Lon; or the plurality of light emitting elements 101 may emit the logic low level signal Ldown; or a part of the plurality of light emitting elements 101 emit the logic high level signal Lon and a part of the plurality of light emitting elements 101 emit the low level signal Ldown. Therefore, the spatial relative positions of the light emitting elements 101 in the plane determined by the first direction X and the second direction Y is combined with the logic high level signals and/or the logic low level signals (i.e., the logic high level signals Lon and/or the logic low level signals Ldown) of the light emitting elements 101 to correspondingly obtain a two-dimensional LIFI signal, thereby correspondingly obtaining an item of binary code information in the two-dimensional space.

It should be noted that FIG. 7 only exemplarily shows eight types of two-dimensional LIFI signals in combination with the structure of the display device 10 shown in FIG. 2, and is not intended to limit the display device 10 and the mobile terminal 00 provided in the embodiments of the present disclosure. In other embodiments, the two-dimensional LIFI signal may be set according to the actual requirements of the display device 10 and the mobile terminal 00, and is not limited in the embodiments of the present disclosure.

Optionally, still referring to FIGS. 2 and 7 and taking each light emitting element 101 corresponding to one light emitting diode as an example, the plurality of light emitting elements 101 are arranged in an array, and at least two of the plurality of light emitting elements 101 for emitting the first LIFI signal are located in a preset row, a preset column or a preset area of the array.

Exemplarily, six columns and five rows of light emitting elements 101 are shown in FIG. 2. Four types of two-dimensional LIFI signals corresponding to the six columns and five rows of light emitting elements 101 are exemplarily shown in FIG. 7, and are respectively: the first two-dimensional LIFI signal L61, the second two-dimensional LIFI signal L62, the third two-dimensional LIFI signal L63 and the fourth two-dimensional LIFI signal L64. Each two-dimensional LIFI signal and the corresponding binary code information in the two-dimensional space can be intuitively observed in FIG. 7, and will not be repeated in this paragraph.

Furthermore, in addition to the above-mentioned case where a two-dimensional LIFI signal is emitted by using all of the light emitting elements 101 in the entire array, the two-dimensional LIFI signal may also be emitted by using only a part of the light emitting elements 101 in the entire array. The part of the light emitting elements 101 may be located in the preset row, the preset column or the preset area of the array.

Exemplarily, the first direction X is a row direction, and the second direction Y is a column direction. At the first time moment t21, the fifth two-dimensional LIFI signal L65 may be formed by the logic high level signals and/or the logic low level signals emitted by only six light emitting elements in the third row. At the second time moment t22, the sixth two-dimensional LIFI signal L66 may be formed by the logic high level signals and/or the logic low level signals emitted by only five light emitting elements in the sixth column. At the third time moment t23, the seventh two-dimensional LIFI signal L67 may be formed by the logic high level signals and/or the logic low level signals emitted by only thirteen light emitting elements in an irregular area shown in the figure. At the fourth time moment t24, the eighth two-dimensional LIFI signal L68 may be formed by the logic high level signals and/or the logic low level signals emitted by merely twelve light emitting elements in a central rectangular area.

It should be noted that FIG. 2 and FIG. 7 merely exemplarily show that the light emitting elements are arranged in an array of six columns and five rows, and are not intended to limit the display device 10 and the mobile terminal 00 provided in the embodiments of the present disclosure.

In other embodiments, the number of the light emitting elements 101 and the arrangement thereof may be set according to the actual requirements of the display device 10 and the mobile terminal 00, and are not limited in the embodiments of the present disclosure.

Next, it should be noted that, FIG. 7 merely exemplarily shows that the number of the light emitting elements 101 for emitting the two-dimensional LIFI signal is five, six, twelve or thirteen, specifically shows the relative positional relationship in the space (in the two-dimensional space) between the light emitting elements 101, and is not intended to limit the display device 10 and the mobile terminal 00 provided in the embodiments of the present disclosure. In other embodiments, the number of and the spatial relative positional relationship between the light emitting elements 101 for emitting a two-dimensional LIFI signal may be set according to the actual requirements of the display device 10 and the mobile terminal 00, and are not limited in the embodiments of the present disclosure.

Figure 8:
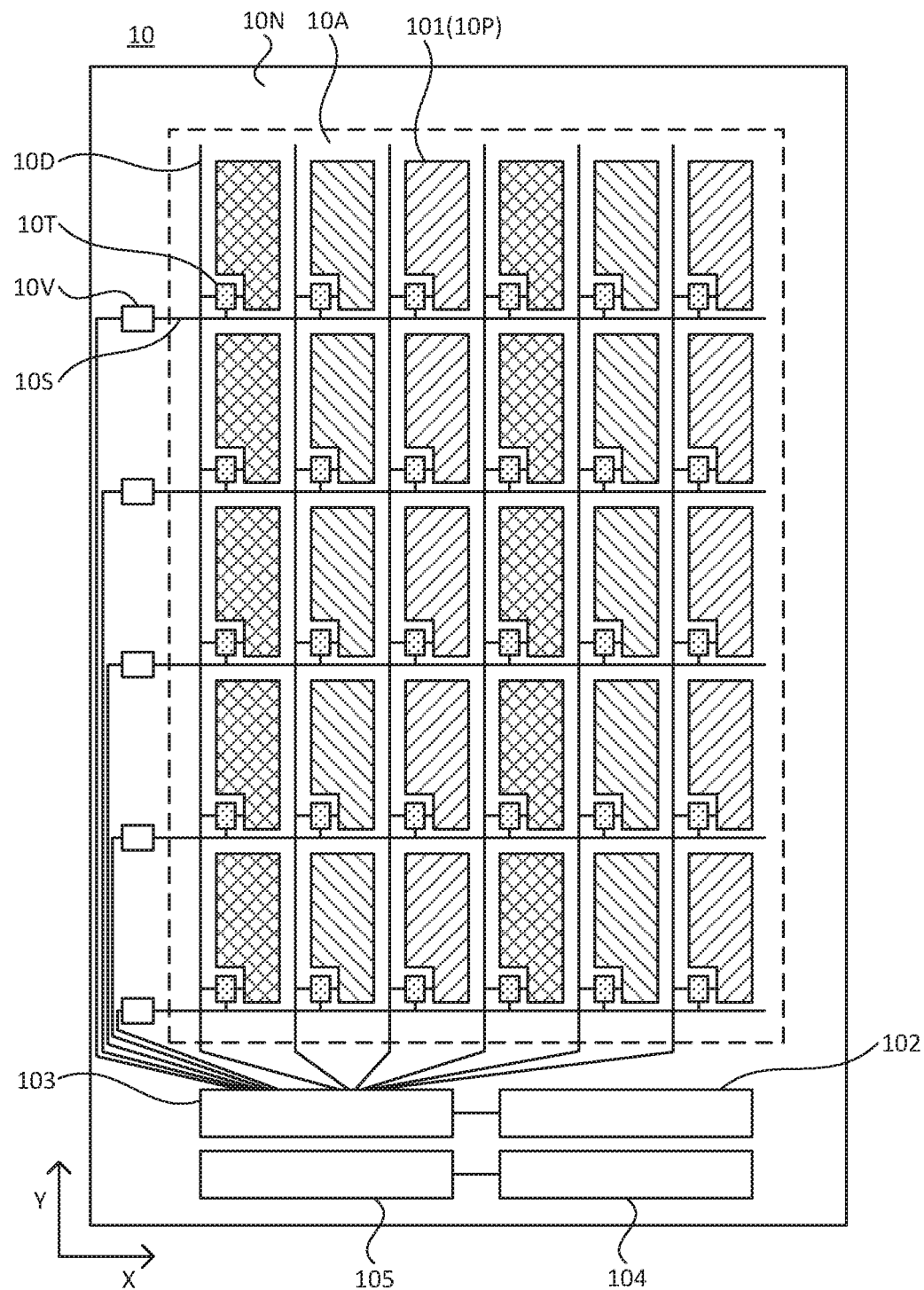
FIG. 8 is a structural diagram of another mobile terminal according to an embodiment of the present disclosure.

Optionally, FIG. 8 is a structural diagram of another mobile terminal according to the embodiment of the present disclosure. Referring to FIG. 8, the display device 10 further includes a LIFI signal receiving assembly 104 and a LIFI signal conversion assembly 105, and the LIFI signal receiving assembly 104 is electronically connected to the LIFI signal conversion assembly 105. The LIFI signal receiving assembly 104 is configured to receive a second LIFI signal; and the LIFI signal conversion assembly 105 is configured to convert the second LIFI signal into an electrical signal corresponding to the second LIFI signal.

The second LIFI signal is another LIFI optical signal. The LIFI signal receiving assembly 104 may receive the LIFI optical signal, and transmit the LIFI optical signal to the LIFI signal conversion assembly 105. The LIFI signal conversion assembly 105 is configured to convert the LIFI optical signal to the electrical signal, that is, to form corresponding encrypted information, and thereby the process of receiving the encrypted information is completed. In combination with the above-mentioned emitting process of the first LIFI signal, a complete process of receiving and sending the LIFI signal can be achieved, that is, the data transmission (or referred to as information interaction) may be achieved in a wireless manner.

Exemplarily, the LIFI signal receiving assembly 104 may be a light sensing element, and the LIFI signal conversion assembly 105 may be an optical signal decoding element.

It should be noted that FIG. 8 merely exemplarily shows that the LIFI signal receiving assembly 104 and the LIFI signal conversion assembly 105 are separately disposed, and is not intended to limit the display device 10 and the mobile terminal 00 provided in the embodiments of the present disclosure. In other embodiments, the spatial relative positional relationship between the LIFI signal receiving assembly 104 and the LIFI signal conversion assembly 105 may also be set according to the actual requirements of the display device 10 and the mobile terminal 00. The LIFI signal receiving assembly 104 and the LIFI signal conversion assembly 105 may also be understood as merely functional divisions, and may be integrated in the same spatial position. The spatial relative positional relationship is not limited by the embodiments of the present disclosure.

Optionally, the LIFI signal receiving assembly 104 includes a photoelectric sensor.

The second LIFI signal may be received by using the photoelectric sensor, and is converted into an electrical signal. The obtained electrical signal is transmitted to the LIFI signal conversion assembly for decoding to obtain the encrypted information.

Meanwhile, the LIFI signal receiving assembly 104 is provided as a photoelectric sensor, so that the structure of the LIFI signal receiving assembly can be simplified.

It should be noted that when the received second LIFI signal is a two-dimensional LIFI signal, the LIFI signal receiving assembly 104 not only has the function of light and dark recognition of the optical signal (the effect is equivalent to receiving the logic high and/or logic low level signals), but also has the function of spatial position recognition of the optical signal.

Optionally, the photoelectric sensor is a photodiode.

With such a setting, the structure of the photoelectric sensor can be simplified, and the design and fabrication difficulty is low, so that the design and fabrication difficulty of the display device 10 and the mobile terminal 00 can be reduced.

It should be noted that the photoelectric sensor may be other types of components having a light-sensing function, and is not limited in the embodiments of the present disclosure.

The process of receiving and sending a LIFI signal of the mobile terminal 00 is exemplarily described below in conjunction with the data flow direction in the mobile terminal 00.

Figure 9:
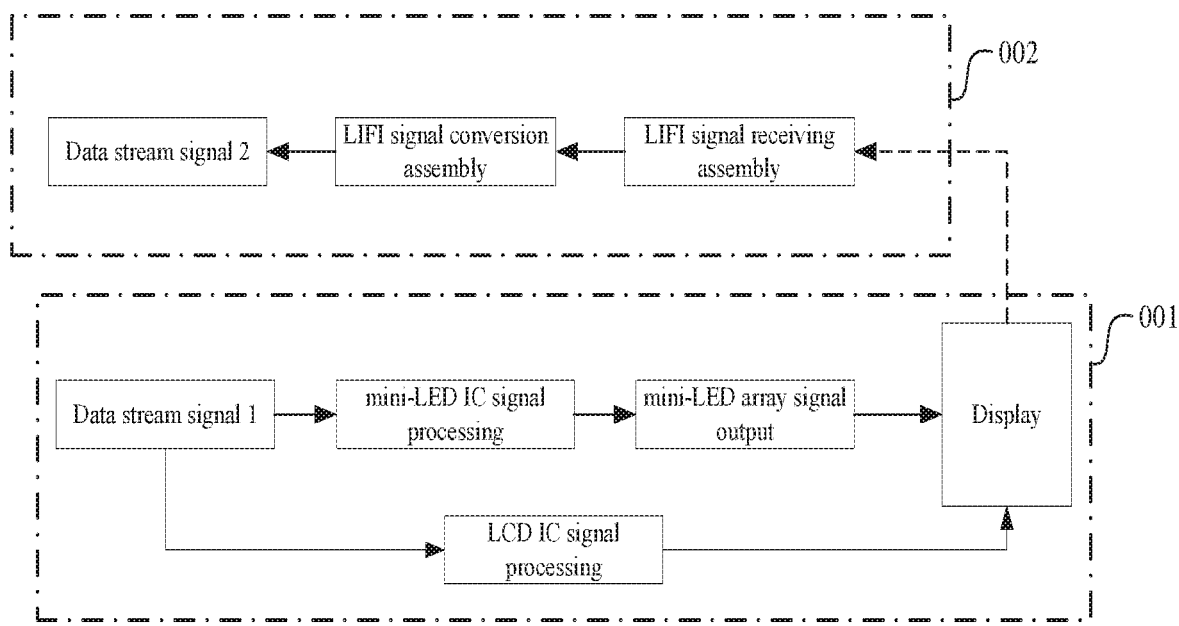
FIG. 9 is a schematic diagram showing a flow direction of a data stream of another mobile terminal according to an embodiment of the present disclosure.

Exemplarily, FIG. 9 is a schematic diagram showing a flow direction of data stream of another mobile terminal according to the embodiment of the present disclosure, and shows the flow direction of the data stream of the mobile terminal when a display device in a first mobile terminal is a liquid crystal display device. Referring to FIG. 9, a first mobile terminal 001 is configured to emit a LIFI signal, and a second mobile terminal 002 is configured to receive the LIFI signal. A data stream signal 1 is an item of binary code information, and includes a display signal and a LIFI sending signal. The data stream signal 1 is simultaneously transmitted to an integrated circuit (IC) of a light emitting element (the light emitting element emits light to provide backlight, and may be a mini-LED) and to an integrated circuit of a liquid crystal display (LCD) panel for respectively processing the mini-LED IC signal and the LCD IC signal. After the mini-LED IC signal is processed, a mini-LED array signal is outputted, that is, the backlight is outputted. The backlight output is combined with the signal output of the liquid crystal display panel, so that the display device can display a to-be-displayed picture. At the same time, the picture displayed by the display device includes the LIFI signal. Therefore, the first mobile terminal 001 achieves the picture display, and synchronously emits the LIFI signal. The LIFI signal receiving assembly of the second mobile terminal 002 receives the LIFI signal and transmits the LIFI signal to the LIFI signal conversion assembly. The LIFI signal conversion assembly converts the LIFI signal into binary code information, that is, a data stream signal 2 is formed. Thereby, the second mobile terminal 002 completes the process of receiving and decoding the LIFI signal.

Figure 10:
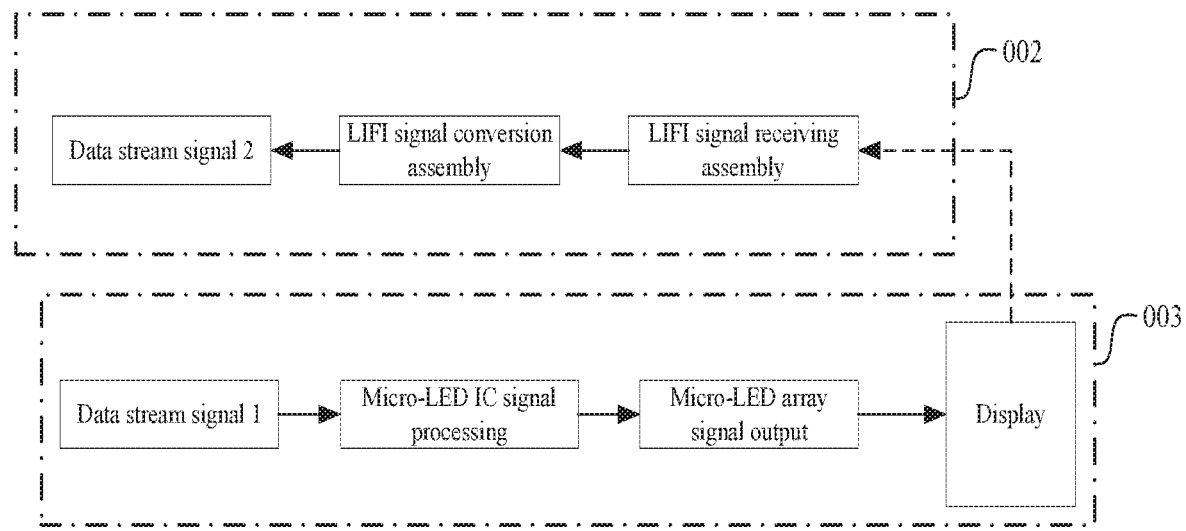
FIG. 10 is a schematic diagram showing a flow direction of a data stream of another mobile terminal according to an embodiment of the present disclosure.

Exemplarily, FIG. 10 is a schematic diagram showing a flow direction of data stream of another mobile terminal according to the embodiment of the present disclosure, and shows the flow direction of data stream of the mobile terminal when a display device in a first mobile terminal is a light emitting diode display device. Referring to FIG. 10, a third mobile terminal 003 is configured to emit a LIFI signal, and the second mobile terminal 002 is configured to receive the LIFI signal. The data stream signal 1 is an item of binary code information, and includes the display signal and the LIFI sending signal. The data stream signal is transmitted to an integrated circuit of a light emitting element (the light emitting element emits light for directly displaying a to-be-displayed picture, and may be a Micro-LED). The Micro-LED IC signal is processed and is then outputted, so that a picture is displayed. At the same time, the displayed picture includes the LIFI signal. Therefore, the third mobile terminal 003 achieves the picture display, and synchronously emits the LIFI signal. The process of receiving and decoding the LIFI signal of the second mobile terminal 002 may be understood by referring to FIG. 9, and details are not described herein again.

It should be noted that a process of receiving and sending a signal of a mobile terminal is exemplarily described by taking the liquid crystal display device as an example in FIG. 9, and a process of receiving and sending a signal of a mobile terminal is exemplarily described by taking the light emitting diode display device as an example in FIG. 10, and FIGS. 9 and 10 are not intended to limit the mobile terminal provided in the embodiments of the present disclosure. In other embodiments, the type of the display device in the mobile terminal may be set according to the actual requirements of the mobile terminal, and the data flow direction is designed according to the type of the display device, which are not limited in this embodiment of the present invention.

Based on the same inventive concept, a method for receiving and sending a LIFI signal of a mobile terminal is further provided in the embodiment of the present disclosure, may be executed by any one of the mobile terminals provided by the above-mentioned embodiments, and therefore, also has the beneficial effects of the mobile terminal provided by the above-mentioned embodiments. Reference may be made to the above description for detailed understanding. Details are not described herein.

The method for receiving and sending a LIFI signal of the mobile terminal includes that: the display device controls, according to the display signal, the plurality of light emitting elements to emit light for displaying the to-be-displayed picture, and controls, according to the LIFI sending signal from the LIFI signal sending control assembly, the at least one of the light emitting element electrically connected to the LIFI signal sending control assembly to emit the first LIFI signal.

The at least one of the plurality of light emitting elements 101 for emitting the first LIFI signal is at least one of the plurality of light emitting elements 101 for displaying the to-be-displayed picture. When the display device displays the same to-be-displayed picture, the first LIFI signals of different frequencies may be synchronously emitted, and thereby the security of the LIFI signal transmission is improved.

The above-mentioned method for receiving and sending a LIFI signal of the mobile terminal is exemplarily described below in conjunction with the components of the mobile terminal.

Figure 11:
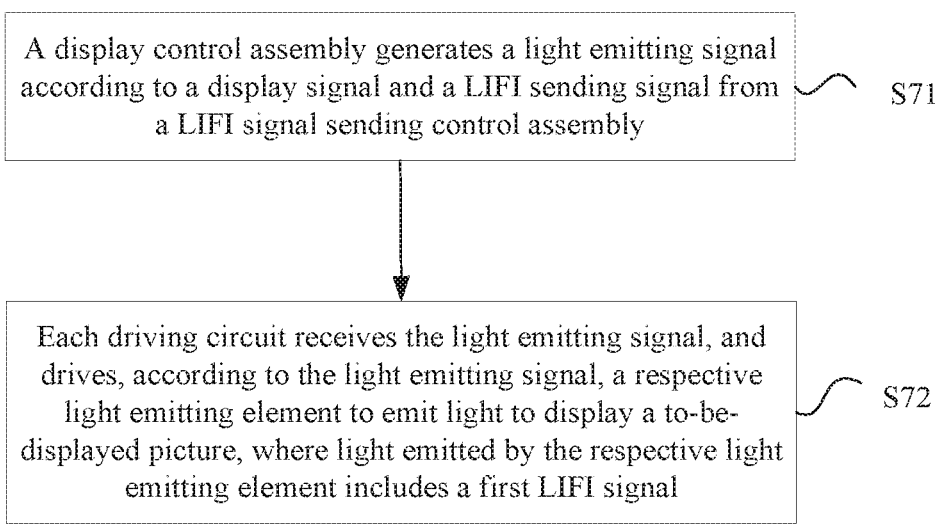
FIG. 11 is a flowchart showing a method for receiving and sending a LIFI signal of a mobile terminal according to an embodiment of the present disclosure.

Exemplarily, FIG. 11 is a flowchart showing a method for receiving and sending a LIFI signal of a mobile terminal according to an embodiment of the present disclosure. Referring to FIG. 11, the method for receiving and sending a LIFI signal of a mobile terminal may include the steps described below.

In S71, the display control assembly generates a light emitting signal according to the display signal and the LIFI sending signal from the LIFI signal sending control assembly.

Exemplarily, when the display device is a liquid crystal display device, the display control assembly includes an integrated circuit assembly that includes backlight. When the display device is a light emitting diode display device, the display control assembly is an integrated circuit assembly that controls the light emitting element to emit light for directly displaying the to-be-displayed picture.

The display control assembly is electrically connected to driving circuits, and is subsequently used to send the light emitting signal to each driving circuit.

In S72, each driving circuit receives the light emitting signal, and drives, according to the light emitting signal, a respective light emitting element to emit light for displaying the to-be-displayed picture. Light emitted by the respective light emitting element includes the first LIFI signal.

Exemplarily, each of the driving circuits is a pixel driving circuit. The pixel driving circuit drives the light emitting element electrically connected thereto to emit light. Since the light emitting signal is generated by combining the real signal with the LIFI sending signal, the light emitted by the light emitting element may be used to display the to-be-displayed picture and may also include the first LIFI signal at the same time.

Optionally, the method for receiving and sending the LIFI signal of the mobile terminal may further include that: when the display device displays a frame of the to-be-displayed picture, the display device 10 further controls the light emitting element to output the first LIFI signal having a preset frequency, so that the light emitting element emits an optical signal having a preset light emitting intensity.

Exemplarily, referring to FIG. 6, the preset light emitting intensity may be a first brightness or a second brightness. If the preset light emitting intensity is the first brightness, the preset frequency may be the first flicker frequency, the second flicker frequency, or the third flicker frequency. If the preset light emitting intensity is the second brightness, the preset frequency may be the fourth flicker frequency or the fifth flicker frequency. Therefore, a same preset light emitting intensity may correspond to a plurality of different preset frequencies, that is, may correspond to a plurality of different first LIFI signals, and thereby the security of the LIFI signal is improved.

Optionally, the first LIFI signal includes a logic high level signal and a logic low level signal. The logic high level signal corresponds to 1 in the binary code, and the logic low level signal corresponds to 0 in the binary code. The method for receiving and sending the LIFI signal of the mobile terminal may further include that: at least two light emitting elements in the display device emit the logic high level signals and/or the logic low level signals at a current moment to emit the first LIFI signal. The first LIFI signal corresponds to an item of binary code information in a two-dimensional space.

Exemplarily, referring to FIG. 7, at the current moment, a two-dimensional LIFI signal may be correspondingly obtained by combining the spatial relative positional relationship of the light emitting elements and the logic high level signals and logic low level signals of the light emitting elements. The two-dimensional LIFI signal corresponds to an item of binary code information in the two-dimensional space.

Certainly, for a single light emitting element, the logic high level signals and/or logic low level signals in the time dimension constitute a one-dimensional LIFI signal. The one-dimensional LIFI signal corresponds to an item of binary code information in the time dimension. For detailed description, reference may be made to FIG. 6 and the above description, and repetition will not be made here.

Figure 12:
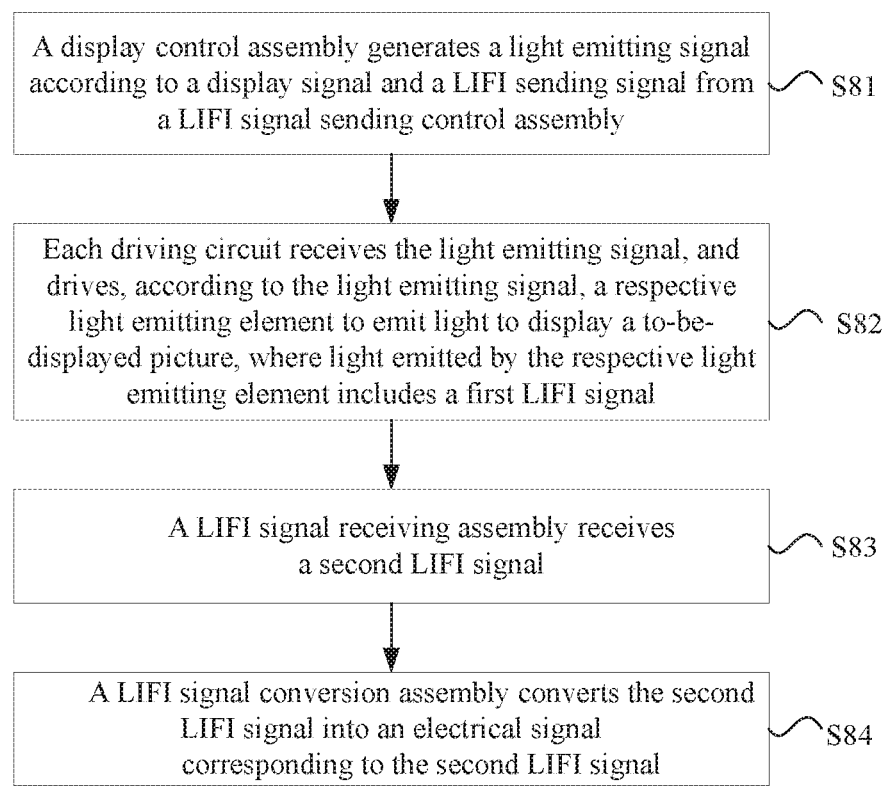
FIG. 12 is a flowchart showing another method for receiving and sending a LIFI signal of a mobile terminal according to an embodiment of the present disclosure.

Optionally, FIG. 12 is a flowchart showing another method for receiving and sending a LIFI signal of a mobile terminal according to an embodiment of the present disclosure. Referring to FIG. 12, the method for receiving and sending a LIFI signal of a mobile terminal may include the steps described below.

In S81, the display control assembly generates a light emitting signal according to the display signal and the LIFI sending signal from the LIFI signal sending control assembly.

In S82, each driving circuit receives the light emitting signal, and drives, according to the light emitting signal, a respective light emitting element to emit light for displaying the to-be-displayed picture. Light emitted by the respective light emitting element includes the first LIFI signal.

In S83, the LIFI signal receiving assembly receives a second LIFI signal.

In S84, the LIFI signal conversion assembly converts the second LIFI signal into an electrical signal corresponding to the second LIFI signal.

The step S81 and the step S82 are performed in sequence, and the sending process of the first LIFI signal can be completed. The step S83 and the step S84 are performed in sequence, and the receiving process of the second LIFI signal can be completed.

It should be noted that, FIG. 12 only exemplarily shows that the sending process of the first LIFI signal is performed first, and then the receiving process of the second LIFI signal is performed, and is not intended to limit the method for receiving and sending a LIFI signal of a mobile terminal provided in the embodiments of the present disclosure. In other embodiments, the execution sequence of the sending process of the first LIFI signal and the receiving process of the second LIFI signal may be set according to the actual requirements of the method for receiving and sending a LIFI signal of a mobile terminal. Of course, for the same mobile terminal, the two processes may also be performed in synchronization, which is not limited by the embodiment of the present disclosure.

For the mobile terminal and the method for receiving and sending a LIFI signal of a mobile terminal provided by the embodiment of the present disclosure, the light emitting element for displaying the to-be-displayed picture may be used to synchronously send the LIFI signal, and the LIFI signal is received through the photoelectric sensor. Thereby the sending and receiving of the LIFI signal of the mobile terminal is implemented, that is, the optical communication is implemented. Compared with wireless transmission technologies such as Bluetooth, the optical communication technology has the advantages of high security, large transmission signal volume, high transmission speed, and convenient transmission manner.

It should be noted that the above are only preferred embodiments of the present disclosure and the technical principles used therein. It will be understood by those skilled in the art that the present disclosure is not limited to the embodiments described herein. Those skilled in the art can make various apparent modifications, adaptations, combinations and substitutions without departing from the scope of the present disclosure. Therefore, while the present disclosure has been described in detail via the above-mentioned embodiments, the present disclosure is not limited to the above-mentioned embodiments and may include more other equivalent embodiments without departing from the concept of the present disclosure. The scope of the present disclosure is determined by the scope of the appended claims.

What is claimed is:

1. A mobile terminal, comprising a display device, wherein the display device is a light emitting diode display device and the display device comprises a plurality of light emitting elements and a light fidelity (LIFI) signal sending control assembly, wherein the LIFI signal sending control assembly is electrically connected to at least one of the plurality of light emitting elements, and the plurality of light emitting elements in the light emitting diode display device are configured to emit light for directly displaying a to-be-displayed picture;

wherein the display device is configured to control, according to a display signal, the plurality of light emitting elements to emit light for displaying the to-be-displayed picture, and the display device is further configured to control, according to a LIFI sending signal from the LIFI signal sending control assembly, the at least one of the plurality of light emitting elements electrically connected to the LIFI signal sending control assembly to emit a first LIFI signal; and wherein the at least one of the plurality of light emitting elements is used to emit the first LIFI signal when the plurality of light emitting elements directly display the to-be-displayed picture;

wherein when the plurality of light emitting elements directly display a same to-be-displayed picture, first LIFI signals of different frequencies are synchronously emitted by the plurality of light emitting elements;

wherein each of the plurality of light emitting elements comprises a first electrode, a second electrode, and a light emitting material layer disposed between the first electrode and the second electrode, and the plurality of light emitting elements include red light emitting elements, green light emitting elements, and blue light emitting elements.

2. The mobile terminal of claim 1, wherein the plurality of light emitting elements are micro-light emitting diodes (micro-LEDs).

3. The mobile terminal of claim 1, wherein the display device further comprises a plurality of driving circuits and a display control assembly, and the plurality of driving circuits are electrically connected to the plurality of light emitting elements in one-to-one correspondence;

wherein the display control assembly is configured to generate a light emitting signal according to the display signal and the LIFI sending signal from the LIFI signal sending control assembly; and each of the plurality of driving circuits is configured to receive the light emitting signal, and drive, according to the light emitting signal, a respective one of the plurality of light emitting elements to emit light for displaying the to-be-displayed picture, wherein light emitted by the respective one of the plurality of light emitting elements comprises the first LIFI signal.

4. The mobile terminal of claim 1, wherein when the display device displays a frame of the to-be-displayed picture, the display device is further configured to control the at least one of the plurality of light emitting elements to output the first LIFI signal having a preset frequency, so that the at least one of the plurality of light emitting elements emits an optical signal having a preset light emitting intensity.

5. The mobile terminal of claim 1, wherein the first LIFI signal comprises a logic high level signal and a logic low level signal, wherein the logic high level signal corresponds to 1 in binary code, and the logic low level signal corresponds to 0 in the binary code; and wherein at least two of the plurality of light emitting elements in the display device are configured to emit the logic high level signal and/or the logic low level signal at a current moment for emitting the first LIFI signal, and the first LIFI signal corresponds to an item of binary code information in a two-dimensional space.

6. The mobile terminal of claim 5, wherein the plurality of light emitting elements are arranged in an array; and
the at least two of the plurality of light emitting elements for emitting the first LIFI signal are located in a preset row, a preset column or a preset area of the array.

7. The mobile terminal of claim 1, wherein the display device further comprises a LIFI signal receiving assembly and a LIFI signal conversion assembly, and the LIFI signal receiving assembly is electronically connected to the LIFI signal conversion assembly;
wherein the LIFI signal receiving assembly is configured to receive a second LIFI signal; and
wherein the LIFI signal conversion assembly is configured to convert the second LIFI signal into an electrical signal corresponding to the second LIFI signal.

8. The mobile terminal of claim 7, wherein the LIFI signal receiving assembly comprises a photoelectric sensor.

9. The mobile terminal of claim 8, wherein the photoelectric sensor is a photodiode.

10. A method for receiving and sending a light fidelity (LIFI) signal, applied in a mobile terminal, wherein the mobile terminal comprises: a display device, wherein the display device is a light emitting diode display device and the display device comprises a plurality of light emitting elements and a light fidelity (LIFI) signal sending control assembly, wherein the LIFI signal sending control assembly is electrically connected to at least one of the plurality of light emitting elements, and the plurality of light emitting elements in the light emitting diode display device are configured to emit light for directly displaying a to-be-displayed picture;
wherein the display device is configured to control, according to a display signal, the plurality of light emitting elements to emit light for directly displaying the to-be-displayed picture, and the display device is further configured to control, according to a LIFI sending signal from the LIFI signal sending control assembly, the at least one of the plurality of light emitting elements electrically connected to the LIFI signal sending control assembly to emit a first LIFI signal; and
wherein the at least one of the plurality of light emitting elements is used to emit the first LIFI signal when the plurality of light emitting elements directly display the to-be-displayed picture; wherein when the plurality of light emitting elements directly display a same to-be-displayed picture, first LIFI signals of different frequencies are synchronously emitted by the plurality of light emitting elements;
wherein each of the plurality of light emitting elements comprises a first electrode, a second electrode, and a light emitting material layer disposed between the first electrode and the second electrode, and the plurality of light emitting elements include red light emitting elements, green light emitting elements, and blue light emitting elements; and
wherein the method comprises: controlling according to the display signal, by the display device, the plurality of light emitting elements to emit light for displaying the to-be-displayed picture, and controlling according to the LIFI sending signal from the LIFI signal sending control assembly, by the display device, the at least one of the plurality of light emitting elements electrically connected to the LIFI signal sending control assembly to emit the first LIFI signal.

11. The method of claim 10, wherein the display device further comprises a plurality of driving circuits and a display control assembly, and the method further comprises:
generating, by the display control assembly, a light emitting signal according to the display signal and the LIFI sending signal from the LIFI signal sending control assembly; and
receiving, by each of the plurality of driving circuits, the light emitting signal, and driving, according to the light emitting signal, a respective one of the plurality of light emitting elements to emit light for displaying the to-be-displayed picture, wherein light emitted by the respective one of the plurality of light emitting elements comprises the first LIFI signal.

12. The method of claim 10, further comprising:
when the display device displays a frame of the to-be-displayed picture, controlling, by the display device, the at least one of the plurality of light emitting elements to output the first LIFI signal having a preset frequency, so that the at least one of the plurality of light emitting elements emits an optical signal having a preset light emitting intensity.

13. The method of claim 10, wherein the first LIFI signal comprises a logic high level signal and a logic low level signal, wherein the logic high level signal corresponds to 1 in binary code and the logic low level signal corresponds to 0 in the binary code; and the method comprises:
emitting, by the at least two of the plurality of light emitting elements in the display device, the logic high level signal and/or the logic low level signal at a current moment to emit the first LIFI signal, wherein the first LIFI signal corresponds to an item of binary code information in a two-dimensional space.

14. The method of claim 10, wherein the mobile terminal further comprises a LIFI signal receiving assembly and a LIFI signal conversion assembly;
the LIFI signal receiving assembly is configured to receive a second LIFI signal; and the LIFI signal conversion assembly is configured to convert the second LIFI signal into an electrical signal corresponding to the second LIFI signal.

* * * * *